United States Patent
Cheng et al.

(10) Patent No.: US 11,509,321 B2
(45) Date of Patent: Nov. 22, 2022

(54) RECEIVING CIRCUIT AND ASSOCIATED SIGNAL PROCESSING METHOD

(71) Applicant: Realtek Semiconductor Corp., HsinChu (TW)

(72) Inventors: Chung-Chieh Cheng, HsinChu (TW); Yi-Chang Tu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 96 days.

(21) Appl. No.: 17/125,911

(22) Filed: Dec. 17, 2020

(65) Prior Publication Data

US 2021/0203336 A1 Jul. 1, 2021

(30) Foreign Application Priority Data

Dec. 25, 2019 (TW) ................... 108147488

(51) Int. Cl.
*H03M 1/06* (2006.01)
*H03F 3/45* (2006.01)

(52) U.S. Cl.
CPC ...... *H03M 1/0614* (2013.01); *H03F 3/45475* (2013.01)

(58) Field of Classification Search
CPC .. H03M 1/0614; H03M 1/0626; H03M 1/188; H03F 1/3223; H03F 1/3211
See application file for complete search history.

(56) References Cited

U.S. PATENT DOCUMENTS

| 7,271,753 | B1* | 9/2007 | Padukone | G11B 5/6029 |
| 7,956,694 | B1* | 6/2011 | Wilson | H03L 7/08 329/308 |
| 9,461,661 | B1* | 10/2016 | Kull | H03M 1/0678 |
| 11,038,516 | B1* | 6/2021 | Azadet | H03M 1/0678 |
| 2006/0052958 | A1* | 3/2006 | Hancock | G01R 21/133 702/60 |
| 2006/0234664 | A1* | 10/2006 | Chiu | H04B 1/109 455/302 |
| 2008/0049875 | A1* | 2/2008 | Cowley | H03D 3/007 375/322 |
| 2008/0298456 | A1* | 12/2008 | Haggis | H04H 20/34 375/295 |
| 2014/0177768 | A1* | 6/2014 | van der Goes | H04L 27/0002 375/349 |

FOREIGN PATENT DOCUMENTS

| TW | 201631330 A | 9/2016 |
| TW | I677192 B | 11/2019 |

* cited by examiner

*Primary Examiner* — Lam T Mai

(74) *Attorney, Agent, or Firm* — Winston Hsu

(57) ABSTRACT

The present invention provides a receiving circuit, wherein the receiving circuit includes a first ADC, an attenuator, a second ADC, a harmonic generation circuit and an output circuit. In the operations of the receiving circuit, the first ADC performs an analog-to-digital operation on an analog input signal to generate a first digital output signal, the attenuator reduces strength of the analog input signal to generate an attenuated analog input signal, the second ADC performs the analog-to-digital operation on the attenuated analog input signal to generate a second digital input signal, the harmonic generation circuit generates at least one harmonic signal according to the second digital input signal, and the output circuit deletes a harmonic component of the first digital input signal by using the at least one harmonic signal to generate an output signal.

18 Claims, 5 Drawing Sheets

RECEIVING CIRCUIT AND ASSOCIATED SIGNAL PROCESSING METHOD

BACKGROUND OF THE INVENTION

1. Field of the Invention

The present invention relates to a receiving circuit, and more particularly to a receiving circuit capable of reducing harmonic distortion of an output signal.

2. Description of the Prior Art

An operational amplifier is a component that is widely used in analog circuits, for example, it can be used in an analog-to-digital converter (ADC). However, if strength of an input signal of the operational amplifier is too large, the operational amplifier will operate in the non-linear region and cause harmonics in the output signal, which will affect the signal quality.

SUMMARY OF THE INVENTION

It is therefore an objective of the present invention to provide a receiving circuit, which can effectively reduce the harmonic distortion of an output signal, to solve the above-mentioned problems.

According to one embodiment of the present invention, a receiving circuit is provided. The receiving circuit comprises a first ADC, an attenuator, a second ADC, a harmonic generation circuit and an output circuit. In the operations of the receiving circuit, the first ADC performs an analog-to-digital operation on an analog input signal to generate a first digital output signal, the attenuator reduces strength of the analog input signal to generate an attenuated analog input signal, the second ADC performs the analog-to-digital operation on the attenuated analog input signal to generate a second digital input signal, the harmonic generation circuit generates at least one harmonic signal according to the second digital input signal, and the output circuit deletes a harmonic component of the first digital input signal by using the at least one harmonic signal to generate an output signal.

According to another embodiment of the present invention, a signal processing method comprises the steps of: performing an analog-to-digital operation on an analog input signal to generate a first digital output signal; reducing strength of the analog input signal to generate an attenuated analog input signal; performing the analog-to-digital operation on the attenuated analog input signal to generate a second digital input signal; generating at least one harmonic signal according to the second digital input signal; and deleting a harmonic component of the first digital input signal by using the at least one harmonic signal to generate an output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
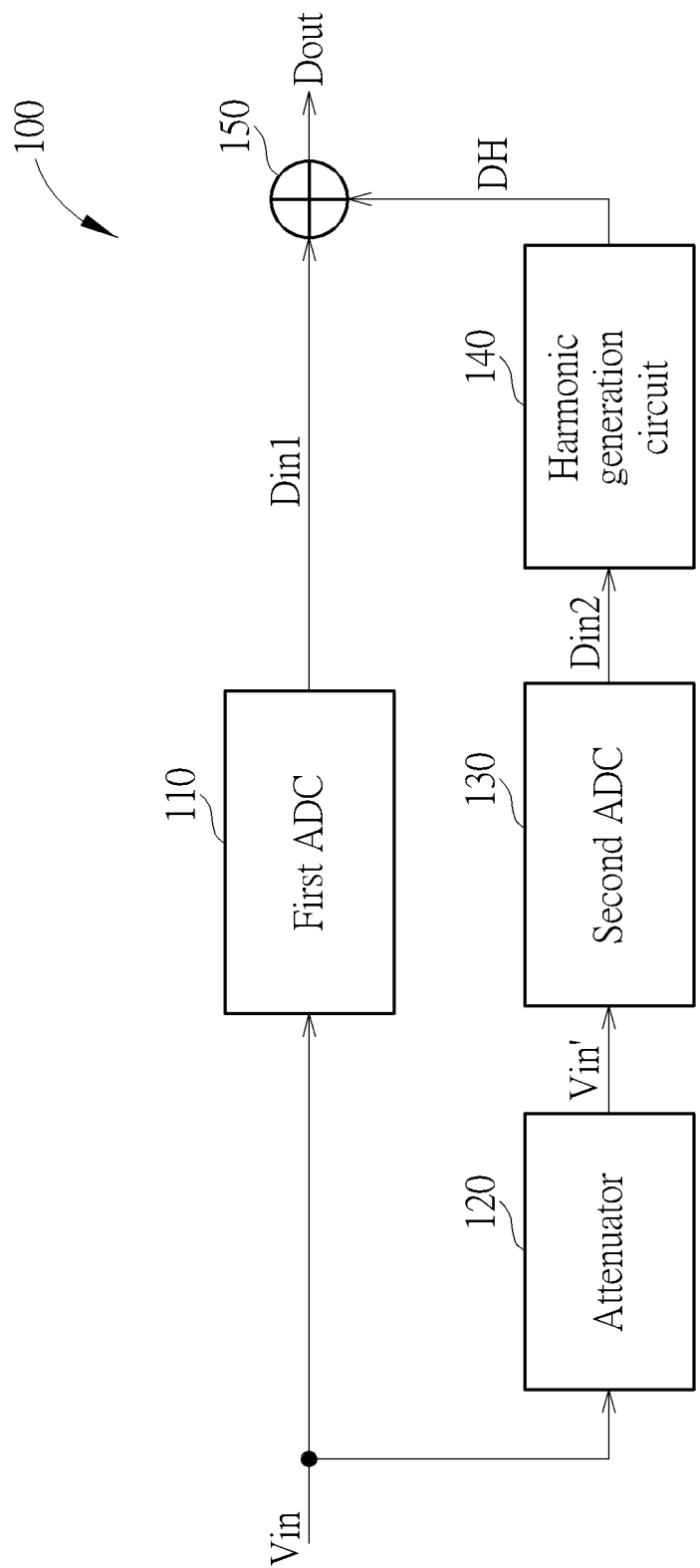
FIG. 1 is a diagram illustrating a receiving circuit according to one embodiment of the present invention.

FIG. 1 is a diagram illustrating a receiving circuit 100 according to one embodiment of the present invention. As shown in FIG. 1, the receiving circuit 100 comprises a first ADC 110, an attenuator 120, a second ADC 130, a harmonic generation circuit 140 and an output circuit 150. In this embodiment, the receiving circuit 100 can be applied to any device for receiving an analog input signal Vin, such as a microphone or other radio device.

In the operations of the receiving circuit 100, the first ADC 110 receives the analog input signal Vin and generates a first digital input signal Din1. However, because the strength of the analog input signal Vin may be too large and the operational amplifier included in the first ADC 110 operates in the non-linear region, the first digital input signal Din1 may contain harmonic components that affect the signal quality. Therefore, In order to eliminate the harmonic components of the first digital input signal Din1, the receiving circuit 100 of this embodiment additionally designs the attenuator 120, the second ADC 130 and the harmonic generation circuit 140 to generate at least one harmonic signal DH, for the output circuit 150 to delete the harmonic component of the first digital input signal Din1 by using the at least one harmonic signal DH to generate an output signal Dout.

Specifically, the attenuator 120 receives the analog input signal Vin and reduces the strength of the analog input signal Vin to generate an attenuated analog input signal Vin'. Then, the ADC 130 performs the analog-to-digital converting operation on the attenuated analog input signal Vin' to generate a second digital input signal Dint. In this embodiment, since the attenuated analog input signal Vin' received by the second ADC 130 has lower strength, the second digital input signal Dint outputted by the second ADC 130 will be located in the linear region, and no harmonic distortion occurs. Then, the harmonic generation circuit 140 generates the harmonic signal DH according to the second digital input signal Dint, for the output circuit 150 to delete the harmonic component(s) of the first digital input signal Din1 to generate the output signal Dout.

As described above, the harmonic signal DH is generated by the harmonic generation circuit 140 according to the second digital input signal Dint without harmonic distortion, so that the harmonic signal DH is very close to the harmonic component of the first digital input signal Din1. The problem of harmonic distortion in the output signal Dout is greatly improved.

Figure 2:
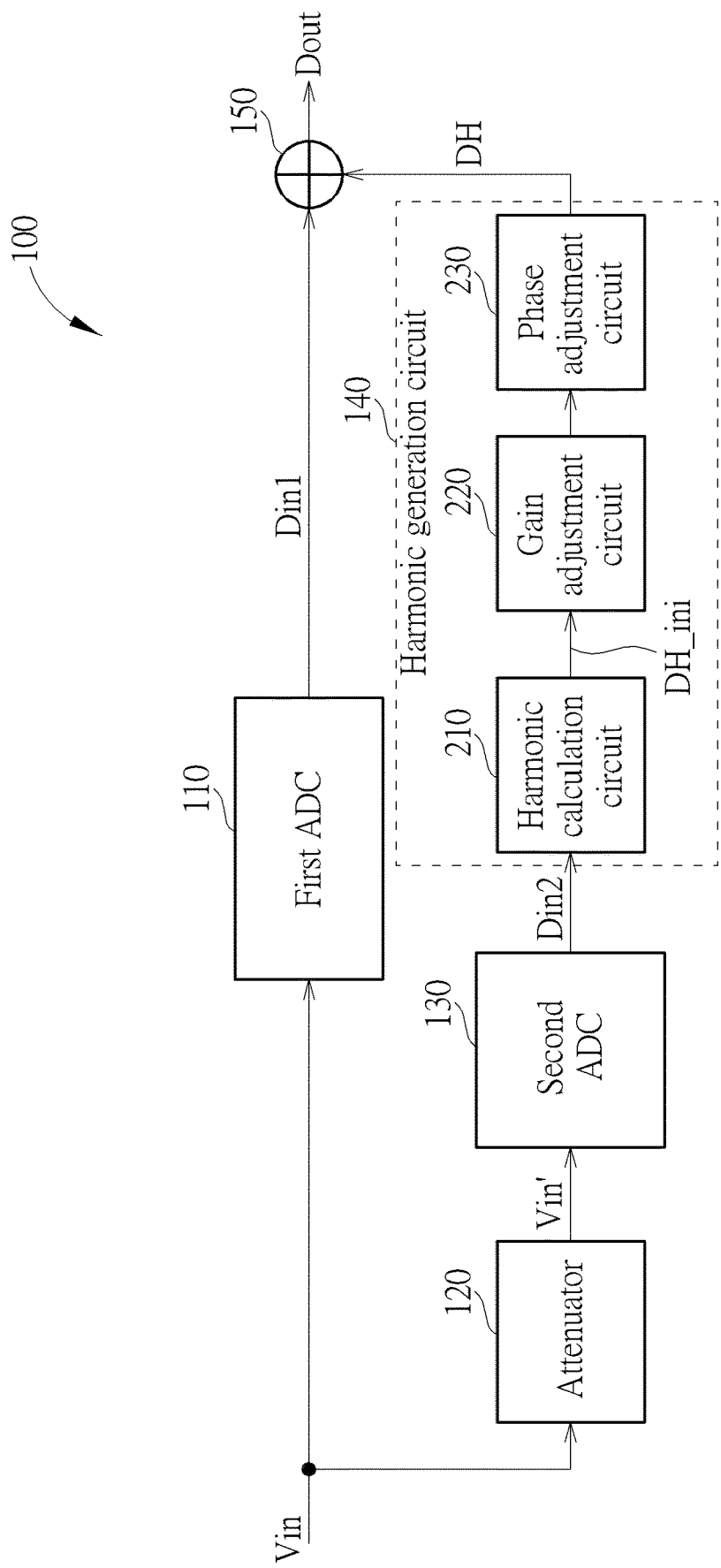
FIG. 2 is a diagram illustrating a harmonic generation circuit according to one embodiment of the present invention.

FIG. 2 is a diagram illustrating the harmonic generation circuit 140 according to one embodiment of the present invention. The harmonic generation circuit 140 comprises a harmonic calculation circuit 210, a gain adjustment circuit 220 and a phase adjustment circuit 230. In the operation of the harmonic generation circuit 140, first, the harmonic calculation circuit 210 generates an initial harmonic signal DH_ini according to a frequency component of the second digital input signal Dint, where the initial harmonic signal DH_ini comprises at least one of the second harmonic, the third harmonic, . . . , Nth harmonic of the second digital input signal Dint. For example, assuming that the frequency component of the second digital input signal Dint is 1 kHz, the frequency of the second harmonic is 2 kHz, the frequency of the third harmonic is 3 kHz, and so on. In an example, the method of generating the harmonics can directly perform a power operation on the second digital input signal Dint. For example, the second digital input signal Dint to the power of two serves as the second harmonic, and the second digital input signal Dint to the power of three serves as the third harmonic. Then, the gain adjustment circuit 220 adjusts the gain of the initial harmonic signal DH_ini, and the phase adjustment circuit 230 adjusts the phase of the initial harmonic signal DH_ini to generate the harmonic signal DH. It should be noted that if the initial harmonic signal DH_ini includes the second harmonic and the third harmonic, the gain adjustment circuit 220 and the phase adjustment circuit 230 include two sets of independent circuits, which are respectively used to adjust the gain and phase of the second harmonic and third harmonic. In addition, in another embodiment, the order of the gain adjustment circuit 220 and the phase adjustment circuit 230 can be reversed, that is, the gain of the initial harmonic signal DH_ini can be adjusted after the phase adjustment, and these alternative designs should fall within the scope of the present invention.

Figure 3:
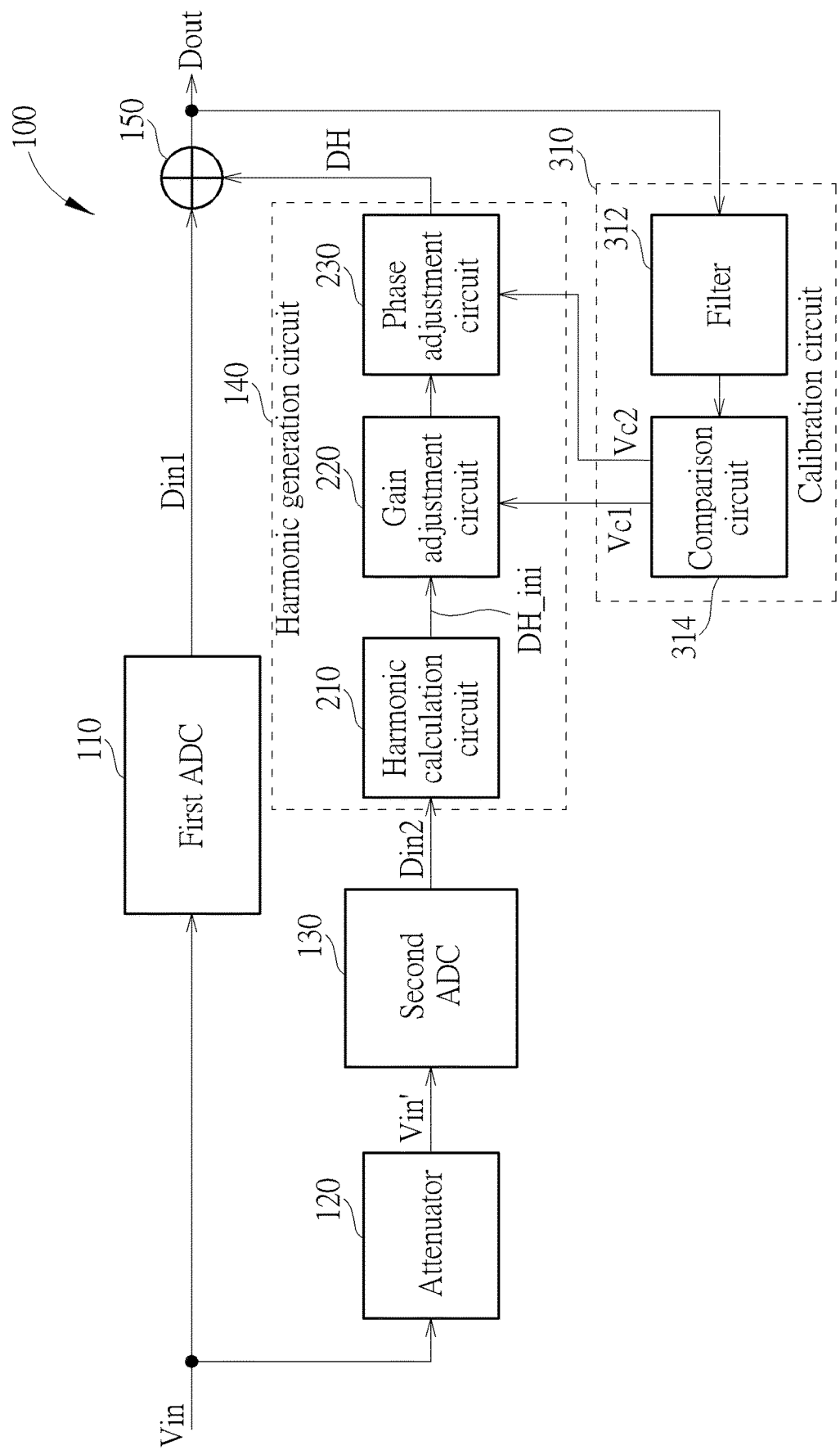
FIG. 3 shows that a receiving circuit comprising a calibration circuit for adjusting a gain of a gain adjustment circuit and phase adjustment amount of a phase adjustment circuit according to one embodiment of the present invention.

In an embodiment, the gain setting of the gain adjustment circuit 220 and the phase adjustment amount of the phase adjustment circuit 230 can be dynamically adjusted according to the output signal Dout, so that the harmonic signal DH can be closer to the harmonic component of the first digital input signal Din1. FIG. 3 shows that the receiving circuit 100 comprising a calibration circuit 310 for adjusting the gain setting of the gain adjustment circuit 220 and the phase adjustment amount of the phase adjustment circuit 230 according to one embodiment of the present invention. In the operation of the calibration circuit 310, the calibration circuit 310 can continuously adjust the gain setting of the gain adjustment circuit 220 and the phase adjustment amount of the phase adjustment circuit 230 according to the strength of the harmonic component of the output signal Dout, so that the strength of the harmonic component of the output signal Dout is lower than a threshold value. Taking the embodiment shown in FIG. 3 as an example, the calibration circuit 310 includes a filter 312 and a comparison circuit 314, wherein the filter 312 filters the output signal Dout to generate a harmonic component of the output signal Dout, and the comparison circuit 314 compares the strength of the harmonic component of the output signal Dout with a threshold value. If the strength of the harmonic component of the output signal Dout is greater than the threshold value, the comparison circuit 314 generates a control signal Vc1 to adjust the gain setting of the gain adjustment circuit 220 and/or generates a control signal Vc2 to adjust the phase adjustment amount of the phase adjustment circuit 230; and if the strength of the harmonic component of the output signal Dout is lower than the threshold value, the comparison circuit 314 stops adjusting the gain setting of the gain adjustment circuit 220 and the phase adjustment amount of the phase adjustment circuit 230. It should be noted that the circuit structure of the calibration circuit 310 shown in FIG. 3 is only used as an example, and it is not a limitation of the present invention.

In the embodiment shown in FIGS. 2 and 3, the purpose of providing the phase adjustment circuit 230 in the harmonic generation circuit 140 is to make the harmonic signal DH have a suitable phase for the output circuit 150 to delete the harmonic component of first digital input signal Din1. However, the phase adjustment circuit 230 may also be positioned between the first ADC 110 and the output circuit 150 to perform a phase delay on the first digital input signal Din1 inputted to the output circuit 150, to achieve the same purpose. Specifically, referring to a receiving circuit 400 shown in FIG. 4, the receiving circuit 400 includes a first ADC 410, an attenuator 420, a second ADC 430, a harmonic generation circuit 440, an output circuit 450 and a delay circuit 460. In the operation of the receiving circuit 400, the first ADC 410 receives the analog input signal Vin and generates a first digital input signal Din1, and the delay circuit 460 delays the first digital input signal Din1 (that is, changes its phase) to generate a delayed first digital input signal Din1'. Then, the attenuator 420 receives the analog input signal Vin and reduces the strength of the analog input signal Vin to generate an attenuated analog input signal Vin'. The second ADC 430 performs the analog-to-digital conversion operation on the attenuated analog input signal Vin' to generate a second digital input signal Dint. In this embodiment, since the attenuated analog input signal Vin' received by the second ADC 430 has lower strength, the second digital input signal Dint outputted by the second ADC 430 will be located in the linear region, and no harmonic distortion occurs. Then, the harmonic generation circuit 440 generates the harmonic signal DH according to the second digital input signal Dint, for the output circuit 150 to delete the harmonic component(s) of the delayed first digital input signal Din1' to generate the output signal Dout.

Figure 4:
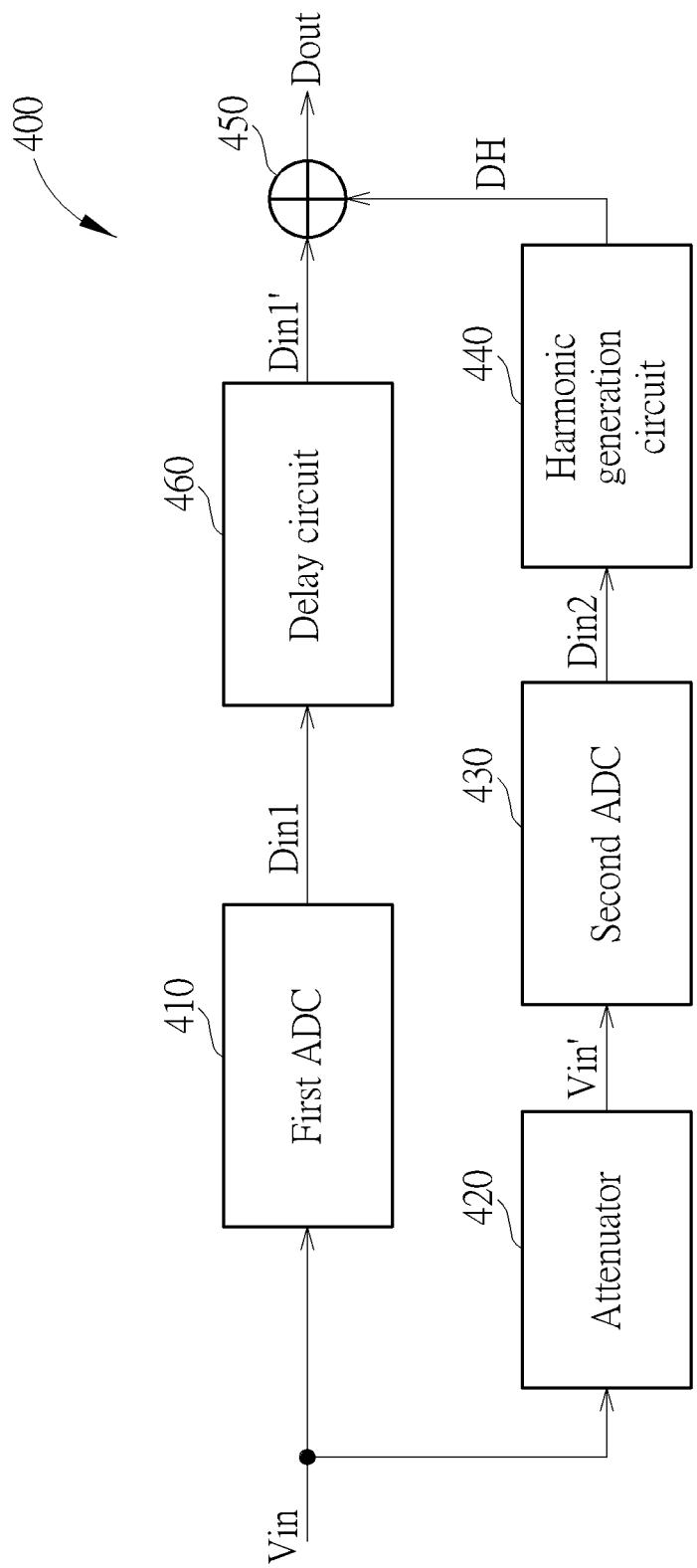
FIG. 4 is a diagram illustrating a receiving circuit according to another embodiment of the present invention.

In the embodiment shown in FIG. 4, the harmonic generation circuit 440 may have the same circuit structure as the harmonic generation circuit 140 shown in FIG. 2, or the harmonic generation circuit 440 may only have the harmonic calculation circuit 210 and the gain adjustment circuit 220 shown in FIG. 2, that is, the function of the phase adjustment circuit 230 is replaced by the delay circuit 460.

Figure 5:
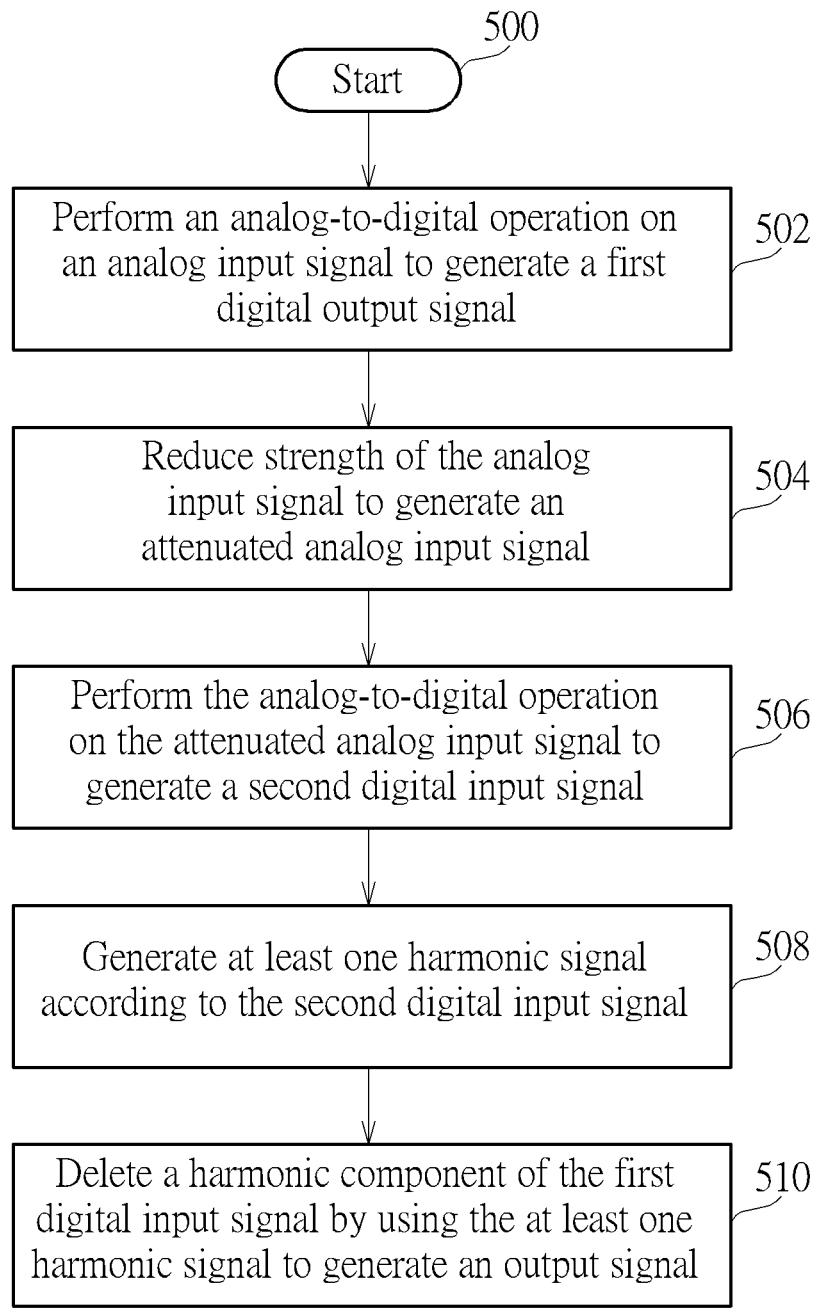
FIG. 5 is a flowchart of a signal processing method according to one embodiment of the present invention.

FIG. 5 is a flowchart of a signal processing method according to one embodiment of the present invention. Referring to the above embodiments, the flow of the signal processing method is described as follows.

Step 500: the flow starts.

Step 502: perform an analog-to-digital operation on an analog input signal to generate a first digital output signal.

Step 504: reduce strength of the analog input signal to generate an attenuated analog input signal.

Step 506: perform the analog-to-digital operation on the attenuated analog input signal to generate a second digital input signal.

Step 508: generate at least one harmonic signal according to the second digital input signal.

Step 510: delete a harmonic component of the first digital input signal by using the at least one harmonic signal to generate an output signal.

Briefly summarized, in the receiving circuit of the present invention, the input signal is attenuated and then performed by an analog-to-digital conversion operation to obtain a second digital input signal, and at least one harmonic signal is calculated based on the second digital input signal, for removing harmonic components of the first digital input signal. Therefore, the present invention can effectively reduce the harmonic distortion of the output signal to improve the signal quality.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A receiving circuit, comprising:
   a first analog-to-digital converter (ADC), configured to perform an analog-to-digital operation on an analog input signal to generate a first digital input signal;
   an attenuator, configured to reduce strength of the analog input signal to generate an attenuated analog input signal;
   a second ADC, configured to perform the analog-to-digital operation on the attenuated analog input signal to generate a second digital input signal;
   a harmonic generation circuit, coupled to the second ADC, configured to generate at least one harmonic signal according to the second digital input signal; and
   an output circuit, coupled to the first ADC and the harmonic generation circuit, configured to delete a harmonic component of the first digital input signal by using the at least one harmonic signal to generate an output signal.

2. The receiving circuit of claim 1, wherein the harmonic generation circuit calculates the at least one harmonic signal according to a frequency component of the second digital input signal.

3. The receiving circuit of claim 1, wherein the output circuit directly subtracts the at least one harmonic signal from the first digital input signal to generate the output signal.

4. The receiving circuit of claim 1, wherein the harmonic generation circuit comprises:
   a harmonic calculation circuit, configured to calculate at least one initial harmonic signal according to the second digital input signal; and
   a gain adjustment circuit, configured to adjust a gain of the at least one initial harmonic signal to generate the at least one harmonic signal.

5. The receiving circuit of claim 4, wherein the harmonic generation circuit further comprises:
   a phase adjustment circuit, wherein the gain adjustment circuit and the phase adjustment circuit adjust the gain and a phase of the at least one initial harmonic signal to generate the at least one harmonic signal.

6. The receiving circuit of claim 5, further comprising:
   a calibration circuit, coupled to the output circuit and the harmonic generation circuit, configured to adjust a gain setting of the gain adjustment circuit and phase adjustment amount of the phase adjustment circuit according to the output signal.

7. The receiving circuit of claim 6, wherein the calibration circuit adjusts the gain setting of the gain adjustment circuit and the phase adjustment amount of the phase adjustment circuit according to a strength of a harmonic component of the output signal, to make the strength of the harmonic component of the output signal be lower than a threshold value.

8. The receiving circuit of claim 4, further comprising:
   a delay circuit, coupled between the first ADC and the output circuit, configured to delay a phase of the first digital input signal inputted into the output circuit.

9. The receiving circuit of claim 4, wherein the at least one initial harmonic signal comprises a second harmonic and a third harmonic.

10. A signal processing method, comprising:
    performing an analog-to-digital operation on an analog input signal to generate a first digital output signal;
    reducing strength of the analog input signal to generate an attenuated analog input signal;
    performing the analog-to-digital operation on the attenuated analog input signal to generate a second digital input signal;
    generating at least one harmonic signal according to the second digital input signal; and
    deleting a harmonic component of the first digital input signal by using the at least one harmonic signal to generate an output signal.

11. The signal processing method of claim 10, wherein the step of generating the at least one harmonic signal according to the second digital input signal comprising:
    calculating the at least one harmonic signal according to a frequency component of the second digital input signal.

12. The signal processing method of claim 10, wherein the step of deleting the harmonic component of the first digital input signal by using the at least one harmonic signal to generate the output signal comprises:
    directly subtracting the at least one harmonic signal from the first digital input signal to generate the output signal.

13. The signal processing method of claim 10, wherein the step of generating the at least one harmonic signal according to the second digital input signal comprises:
    calculating at least one initial harmonic signal according to the second digital input signal; and
    using a gain adjustment circuit to adjust a gain of the at least one initial harmonic signal to generate the at least one harmonic signal.

14. The signal processing method of claim 13, wherein the step of generating the at least one harmonic signal according to the second digital input signal comprises:
    using the gain adjustment circuit and a phase adjustment circuit to adjust the gain and a phase of the at least one initial harmonic signal to generate the at least one harmonic signal.

15. The signal processing method of claim 14, further comprising:
    adjusting a gain setting of the gain adjustment circuit and phase adjustment amount of the phase adjustment circuit according to the output signal.

16. The signal processing method of claim 15, wherein the step of adjusting the gain setting of the gain adjustment circuit and the phase adjustment amount of the phase adjustment circuit according to the output signal comprises:
    adjusting the gain setting of the gain adjustment circuit and the phase adjustment amount of the phase adjustment circuit according to a strength of a harmonic component of the output signal, to make the strength of the harmonic component of the output signal be lower than a threshold value.

17. The signal processing method of claim 13, further comprising:
    delaying a phase of the first digital input signal for the generation of the output circuit.

18. The signal processing method of claim 13, wherein the at least one initial harmonic signal comprises a second harmonic and a third harmonic.

* * * * *